US008853935B2

United States Patent
Ohazama

(10) Patent No.: US 8,853,935 B2
(45) Date of Patent: Oct. 7, 2014

(54) ORGANIC EL MODULE INCLUDING AN ELEMENT SUBSTRATE AND A POLE TO CONNECT A PLURALITY OF TERMINALS

(75) Inventor: Hidetaka Ohazama, Yonezawa (JP)

(73) Assignees: Pioneer Corporation, Kanagawa (JP); Tohoku Pioneer Corporation, Yamagata (JP)

( * ) Notice: Subject to any disclaimer, the term of this patent is extended or adjusted under 35 U.S.C. 154(b) by 0 days.

(21) Appl. No.: 13/552,024

(22) Filed: Jul. 18, 2012

(65) Prior Publication Data
US 2013/0020935 A1   Jan. 24, 2013

(30) Foreign Application Priority Data
Jul. 19, 2011   (JP) .................. 2011-158358

(51) Int. Cl.
*H01J 1/62*       (2006.01)
*H01J 63/04*      (2006.01)
*H01L 27/32*      (2006.01)
*H01L 51/52*      (2006.01)
*H01L 51/56*      (2006.01)

(52) U.S. Cl.
CPC ......... *H01L 27/3276* (2013.01); *H01L 27/3288* (2013.01); *H01L 51/524* (2013.01); *H01L 51/5246* (2013.01); *H01L 51/529* (2013.01); *H01L 51/56* (2013.01)
USPC ........... 313/504; 313/483; 313/500; 313/501; 313/502; 313/503; 313/505; 313/506

(58) Field of Classification Search
None
See application file for complete search history.

(56) References Cited

U.S. PATENT DOCUMENTS 7,541,619 B2 *   6/2009   Sakurai et al. .................. 257/82

FOREIGN PATENT DOCUMENTS

JP   2006106082 A   4/2006
JP   2010170773 A   8/2010

OTHER PUBLICATIONS

English Patent Abstract of JP 2006-106082, Publication Date: Apr. 20, 2006 (1 page).
English Patent Abstract of JP 2010-170773, Publication Date: Aug. 5, 2010 (1 page).

* cited by examiner

*Primary Examiner* — Natalie Walford
(74) *Attorney, Agent, or Firm* — Osha Liang LLP

(57) ABSTRACT

An organic EL module includes an element substrate on which at least one organic EL element is formed, a first terminal provided on the element substrate and is drawn out from the electrode of the at least one organic EL element, a second terminal facing the first terminal and provided on a circuit substrate, and a pole that electrically connects the first terminal with the second terminal through a through-hole of the circuit substrate.

20 Claims, 6 Drawing Sheets

ORGANIC EL MODULE INCLUDING AN ELEMENT SUBSTRATE AND A POLE TO CONNECT A PLURALITY OF TERMINALS

FIELD OF THE INVENTION

The present invention relates to an organic EL module including a circuit substrate.

BACKGROUND OF THE INVENTION

A self-emission panel (organic EL panel) provided with an organic EL element is used for display screens of mobile phones, monitor screens of electronic devices in automobiles or for family use, and information display screens of PCs and TVs. The organic EL panel is also used for various types of display devices such as advertising light-emitting panels, various types of light sources in scanners and printers, and illuminating devices such as generally-used lighting systems and back-lighting of LCDs. Further, the organic EL panel is available for various applications and devices such as optical communication devices using the photoelectric conversion function.

Since the light-emission properties of organic EL elements deteriorate when exposed to moisture, etc., a sealing structure for separating the organic EL element from the atmosphere is inevitable in order to use an organic EL panel for a long time in a stable condition. As examples of the sealing structure, a hollow sealing structure which forms a sealed space surrounding an organic EL element by joining a substrate on which the organic EL element is formed and a sealing substrate and a film sealing structure which covers the organic EL element with a sealing layer (sealing film) are known.

Meanwhile, in order to mount a circuit element or a circuit substrate for driving an organic EL element on an organic EL panel, a terminal drawn out from the organic EL element is conventionally arranged in the periphery portion of a substrate on which the organic EL element is formed such that the circuit element and circuit substrate are connected to the terminal, for example as shown in a patent literature 1 described below. Further, as another embodiment, a circuit element is arranged on a sealing substrate which seals an organic EL element such that a wire formed on the sealing substrate is connected to the circuit element as described in a patent literature 2 shown below.

PATENT LITERATURE

[Patent literature 1] Japanese laid-open patent publication 2010-170773
[Patent literature 2] Japanese laid-open patent publication 2006-106082

If a circuit element and a circuit substrate are connected to the periphery portion of the substrate on which the organic EL element is formed as described in the patent literature 1, the organic EL element cannot be formed in the periphery portion, and thus it is impossible to use the whole substrate as a light emitting region (active area). Therefore, it is difficult to adopt the structure described in the patent literature 1 for a device such as a small-size mobile terminal which needs as large active area as possible within the device. Also, when a comparatively large panel (tiling panel) is acquired by planarly arranging a plurality of panels, if a fringe portion that becomes a non light emitting portion is formed in the periphery of the substrate in a single panel the joints of the plurality of panels stand out, and therefore, a high quality of display and illumination cannot be ensured as a whole tiling panel.

In contrast, if a circuit element and a circuit substrate are mounted on a sealing substrate which seals the organic EL element as shown in the patent literature 2, a comparatively larger active area can be ensured within the substrate on which the organic EL element is formed. However, since the hollow sealing structure, which is obtained by joining the sealing substrate and the substrate on which the organic EL element is formed, is preliminarily required, an adhesive region becomes necessary, thus the adhesive region will form a non-light emitting fringe portion in the periphery of the substrate.

Also, since a module which arranges a circuit element and a circuit substrate on the sealing substrate has a thickness generated by adding the thickness of the circuit element and so forth to the thickness of a panel that is generated by the hollow sealed space, the thickness of the whole module on which the circuit element is mounted is increased, and therefore the reduction in thickness of an electronic device in which the module is incorporated cannot be addressed. Further, in order to manufacture such a module a wiring process applied to the sealing substrate as well as a process of joining the sealing substrate to the substrate on which the organic EL element is formed, are required, and therefore an assembling process including the mounting of a drive circuit becomes complicated.

SUMMARY OF THE INVENTION

One or more embodiments of the present invention make it possible to enlarge an active area within an element substrate on which at least one organic EL element is formed in an organic EL module which has a drive circuit mounted on an organic EL panel, to make it possible to improve the functional quality of a tiling panel formed with a plurality of planarly arranged panels by narrowing the fringe portion that is in the periphery of an element substrate, to make it possible to reduce the thickness of the organic EL module as a whole, to make it possible to simplify an assembling process including the mounting of a drive circuit, and so on.

The organic EL module according to one or more embodiments of the present invention includes at least a configuration described below.

An organic EL module includes an element substrate on which an organic EL element is formed, a first terminal provided on the element substrate and is drawn out from the electrode of the at least one organic EL element, a second terminal facing the first terminal and provided on a circuit substrate, and a pole that electrically connects the first terminal with the second terminal through a through-hole of the circuit substrate.

DETAILED DESCRIPTION OF THE INVENTION

Figure 1:
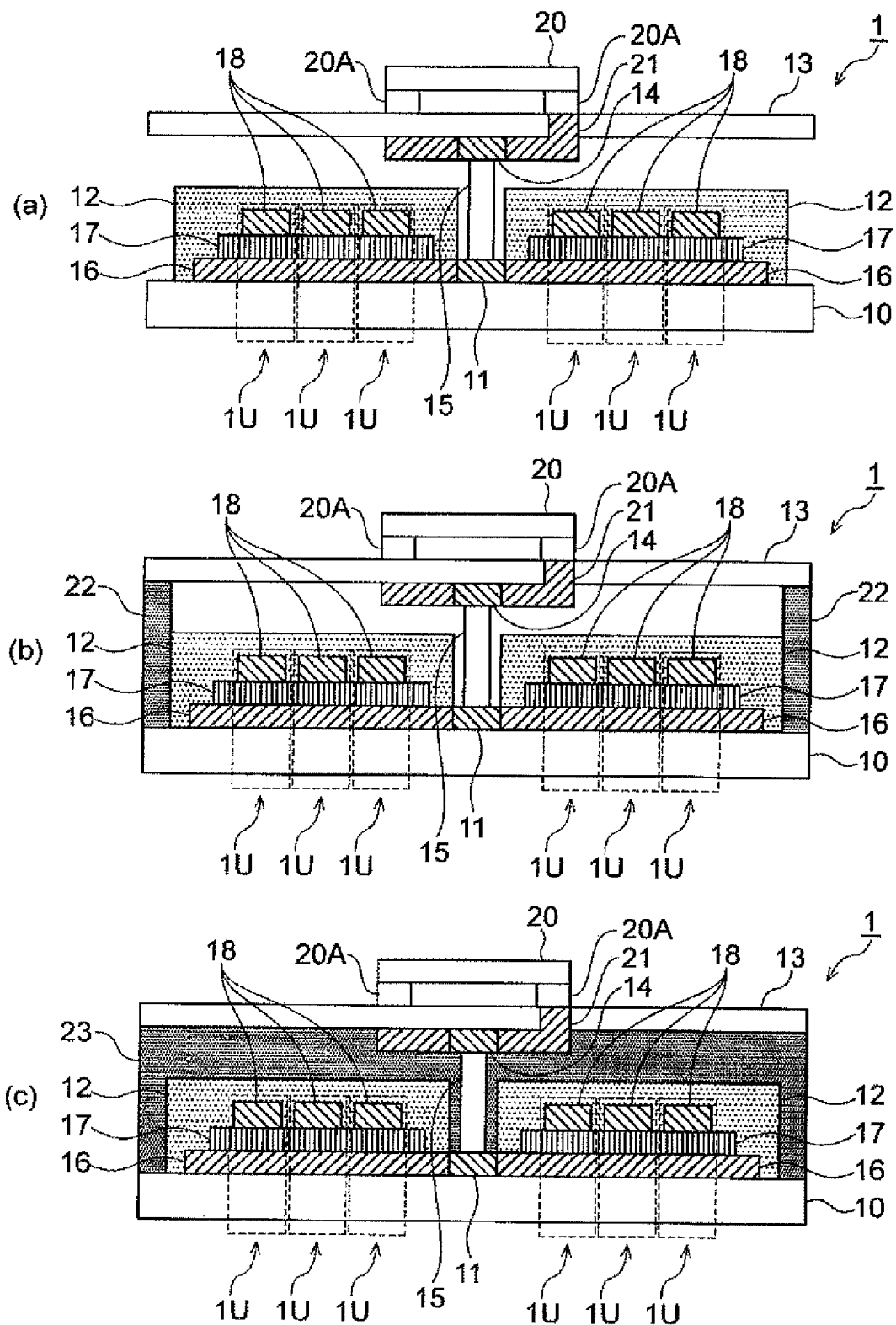
FIG. 1 is a view (conceptual diagram) illustrating a basic configuration of the organic EL module according to one or more embodiments of the present invention.

Hereinafter, one or more embodiments according to the present invention are described with reference to the drawings. FIG. 1 is a view (conceptual diagram) illustrating a basic configuration of the organic EL module according to one or more embodiments of the present invention. Although mutually different embodiments are shown in FIGS. 1(a), 1(b) and 1(c), the same symbols are applied to common parts, and thus duplicated descriptions are eliminated.

An organic EL module 1 includes an element substrate 10 on which a single or a plurality of organic EL elements 1U are formed, a first terminal 11 which is provided on the element substrate 10 and is drawn out from the electrode of the organic EL elements 1U, a sealing layer 12 which covers the organic EL elements 1U, a circuit substrate 13 which is arranged over the sealing layer 12 at some interval, a second terminal 14 which is provided beneath the circuit substrate 13, and a pole 15 which electrically connects the first terminal 11 with the second terminal 14 while supports the circuit substrate 13 over the element substrate 10.

The organic EL element 1U is configured with a lower electrode 16 which is formed on the element substrate 10, an organic EL layer 17 which is laminated on the lower electrode 16 and an upper electrode 18 which is laminated on the organic EL layer 17, and one of the lower electrode 16 and the upper electrode 18 functions as a cathode while the other electrode functions as an anode, and light is emitted from the side of the element substrate 10 which is light transmissive. The arrangement pattern of the organic EL elements 1U on the element substrate 10 may include any pattern such as a pattern of arranging a plurality of organic EL elements 1U in the form of dot matrix, a pattern of arranging the plurality of organic EL elements 1U for each of segments having a variety of pattern shapes, and a pattern of arranging the plurality of organic EL elements 1U throughout a given region on the element substrate 10. Further, the drive style of the organic EL elements 1U arranged in the form of dot matrix may be a passive drive style or an active drive style. Further, although the first terminal 11 is drawn out from the lower electrode 16 in FIG. 1, the first terminal 11 is also drawn out from the upper electrode 18, which is not shown in the drawings.

The organic EL element 1U is covered with the sealing layer 12 and no sealed space exists over the organic EL element 1U. Hereby, the thickness of the whole organic EL module 1 can be reduced. Any material may be used for the sealing layer 12 only if it has a barrier function with respect to a degradation factor of the organic EL element 1U such as water, oxygen and so forth, and thus the sealing layer 12 may adopt various types of inorganic films, multilayer films composed of a polymer film and an inorganic film, and so on. In icular, by adopting an inorganic amorphous film formed by atomic layer deposition, it is possible to improve the coatability in the structural body surface of the organic EL element 1U while acquiring a high barrier function. The sealing layer 12 is pattern formed so as to exclude the overhead portion of the first terminal 11 on the element substrate 10. Hereby, the first terminal 11 cannot be covered with the film forming material of the sealing layer 12, and thus the electric connection performance between the first terminal 11 and the pole 15 can be prevented from being lowered.

The circuit substrate 13 has a drive element 20 mounted thereon to drive the organic EL element 1U, or has a wiring pattern which is formed to connect with other circuit substrates. In the example shown in the drawings, the second terminal 14 is provided beneath the surface of the circuit substrate 13 opposite the element substrate 10 while the drive element 20 is mounted on the reverse side surface of the circuit substrate 13 with respect to the element substrate 10. A terminal 20A of the drive element 20 is electrically connected to the second terminal 14 by a wiring pattern 21 passing through a through-hole. As a material for the circuit substrate 13, a resin material having insulating property, a ceramic material, or a chip itself cut out from a semiconductor wafer (silicon substrate), can be used.

The pole 15 has conductive property and electrically connects the first terminal 11 on the element substrate 10 with the second terminal 14 beneath the circuit substrate 13 while having mechanical intensity for supporting the circuit substrate 13 over the element substrate 10. The pole 15 has a conduction path, which corresponds to the terminal patterns of the first terminal 11 and the second terminal 14 in order to electrically connect the first terminal 11 with the second terminal 14. The pole 15 may be separated and individually arranged for each conduction path, or if the pole 15 is integrally arranged, the pole 15 includes an insulating portion for insulating the conduction paths from each other.

Although the pole 15 may be configured with a conductive material such as metal which has conductivity by itself, the material is not limited to metal. The pole 15 may be also configured with conductive adhesive agent capable of obtaining necessary supporting strength when hardened, a conductive film capable of obtaining conductivity when compressed (anisotropic conductive film), or a conductive substrate having a conduction path therein and so forth.

Further, the pole 15 may be formed separately from the circuit substrate 13 or may be formed integrally with the circuit substrate 13. When the circuit substrate 13 and the pole 15 are integrally formed, the circuit substrate 13 which forms the second terminal 14 is subjected to an etching process and so forth to form the convex shape pattern of the pole 15.

According to the organic EL module 1 having such a feature, the thickness of the whole module can be reduced by sealing the organic EL element 1U with the sealing layer 12. Further, by providing the pole 15, the circuit substrate 13 can be arranged in the upper position of the sealing layer 12. As such, there is no need to provide a space for connecting a drive circuit on the element substrate 10 on which the organic EL element 1U is formed, and thus it becomes possible to make substantially the whole of the element substrate 10 to be a light emitting region (active area). In this way, the organic EL module 1 according to one or more embodiments of the present invention can realize both the reduction in thickness for the whole module and the expansion of the active area, which cannot have been achieved by prior arts.

Further, since the circuit substrate 13 is arranged so as to cover the sealing layer 12, the circuit substrate 13 which is supported by the pole 15 serves to protect the sealing layer 12 from external forces. As such, when the organic EL module 1 is incorporated in an electronic device and so on, an internal component such as an electronic part is prevented from coming into contact with the sealing layer 12, and thus the sealing performance of the organic EL element 1U can be can be improved.

Further in comparison with a prior art in which a circuit element is mounted on the sealing substrate, the processing of the sealing substrate and a step of joining the sealing substrate and the element substrate can be eliminated. Further, the connection with the circuit element can be accomplished only by aligning the circuit substrate 13 on the pole 15 and connecting the first terminal 11 with the second terminal 14 via the pole 15, and thus an assembly process including the mounting of a drive circuit can be simplified.

Further, a space for connecting the drive circuit and an adhesive space for joining the sealing substrate are not required in the periphery of the element substrate 10, and thus the fringe portion in the periphery of the element substrate 10 can be made narrow. Hereby, when a tiling panel is configured by arranging a plurality of the element substrates 10 in the organic EL modules 1, the joints between the respective organic EL modules 1 can be made less outstanding and the function quality as a tiling panel can be improved when used for a display or illumination.

One or more embodiments according to FIG. 1(a) include the features as described above. One or more embodiments according to in FIG. 1(b) include a reinforcing supporting pole 22 for reinforcement is provided between the element substrate 10 and the circuit substrate 13. The reinforcing supporting pole 22 is provided in the periphery of the element substrate 10 when the pole 15 is arranged in the central portion of the element substrate 10 as shown in each example of FIG. 1. Even when the reinforcing supporting pole 22 is provided in the periphery of the element substrate 10, the space occupied by the reinforcing supporting pole 22 on the element substrate 10 can be significantly minimized in comparison with the connecting space for the drive circuit or the adhesive space for the sealing substrate. By providing such a reinforcing supporting pole 22, the circuit substrate 13 is prevented from being deformed and thereby the end of the circuit substrate 13 is prevented from coming into contact with the sealing layer 12. Thus, it is possible to further increase the protection function of the circuit substrate 13 with respect to the sealing layer 12.

One or more embodiments according to FIG. 1(c) include a filler member 23 is filled between the element substrate 10 and the circuit substrate 13 in addition to the configuration of one or more embodiments according to FIG. 1(a). The end faces of the element substrate 10, the circuit substrate 13 and the filler member 23 are flush with each other. The filler member 23, when being in a fluid state, may be filled in the gap between the element substrate 10 and the circuit substrate 13 and is hardened thereafter, in order to have a given bending or compressing strength. Various types of resin materials can be used as the filler member 23. Also, by providing such a filler member 23, the circuit substrate 13 is prevented from being deformed and thereby the end of the circuit substrate 13 is prevented from coming into contact with the sealing layer 12. Thus, it is possible to further increase the protection function of the circuit substrate 13 with respect to the sealing layer 12. In order to further increase the protection function with respect to the sealing layer 12, the reinforcing supporting pole 22 as shown in FIG. 1(b) may be added to the configuration of one or more embodiments shown in FIG. 1(c).

Figure 2:
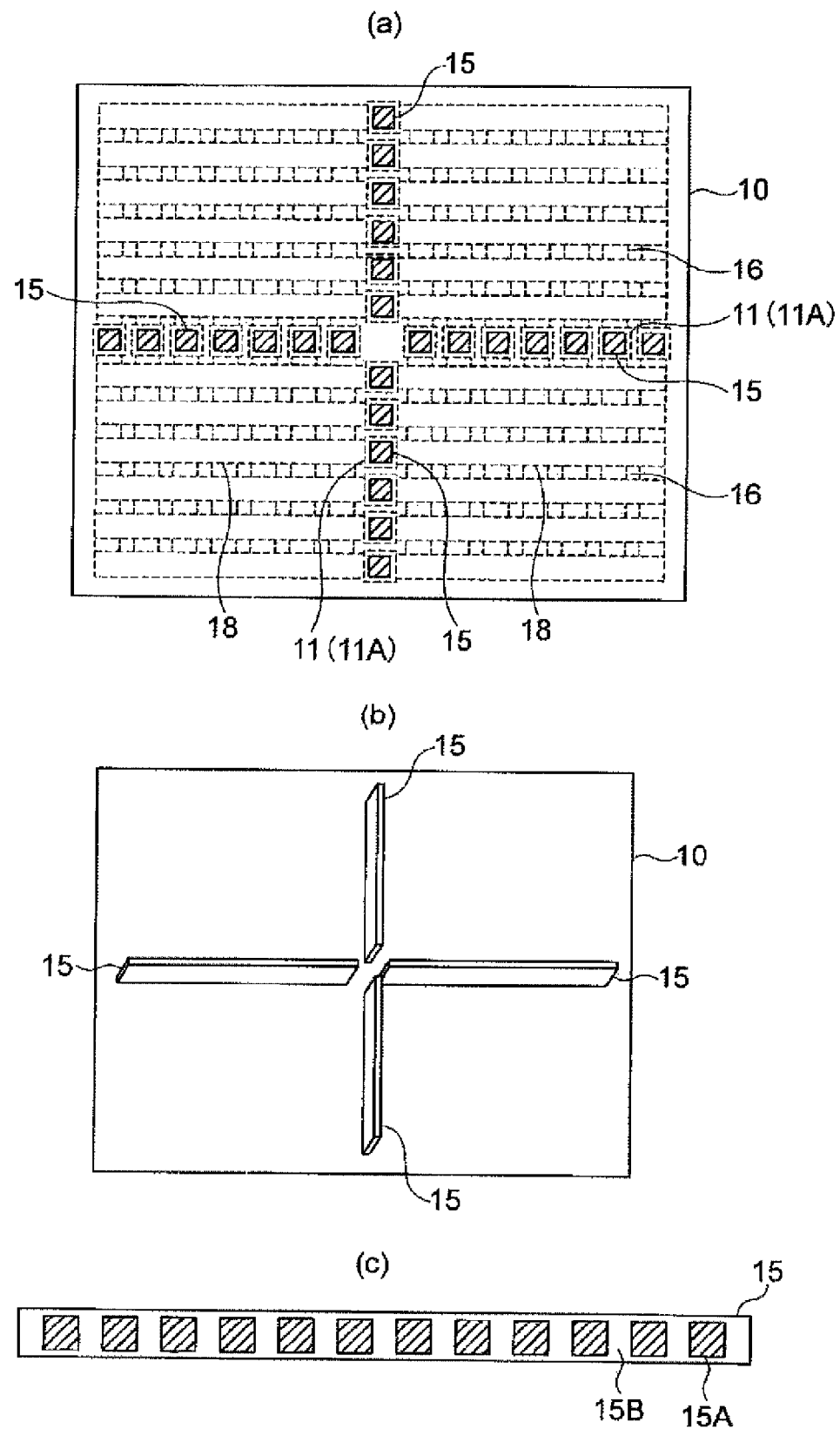
FIG. 2 is a view illustrating a specific structural example of a pole in the organic EL module according to one or more embodiments of the present invention.

FIG. 2 is a view illustrating a specific structural example of the pole. In an example shown in FIG. 2(a), the pole 15 is arranged inside the element substrate 10. In this example, the poles 15 are separately arranged respectively on the first terminal 11 (11A) connected to the lower electrode 16 and on the first terminal 11 (11B) connected to the upper electrode 18, and are scattered on the element substrate 10 in accordance with the arrangement pattern of the first terminal s 11A, 11B which is vertically and horizontally arranged in a cross shape.

When the respective poles 15 are separately arranged for each of the first terminal s 11 as shown in FIG. 2(a), the respective poles 15 can be configured with a conductive member. As an example of the conductive member, high conductivity metal such as Al and Cu can be used. In this example the poles 15 are separately arranged so that they are electrically insulated from each other due to an interval therebetween. In an example shown in the drawings, the pole 15 has a rectangular cross-section, but is not limited to this shape, the pole 15 may have circular, elliptical and polygonal cross-sections. Further, in order for the end s of the respective poles 15 to be connected with the second terminal 14 of the planar circuit substrate 13, the plurality of the poles 15 has a uniform height.

The poles 15 can be integrally formed in whole or in as shown in FIGS. 2(b) and 2(c). The poles 15 which are integrally formed as described above are provided so as to extend along the element substrate 10, whereby the supporting strength for the circuit substrate 13 can be increased. The pole 15 has a plurality of conductive s (conduction path) 15A which are mutually insulated and connect the first terminal 11 with the second terminal 14, and an insulating portion 15B is provided between the respective conductive s 15A. The poles 15 are integrally formed so as to include the conductive 15A and the insulating portion 15B as described above, whereby the conductive 15A can ensure high conductivity while the insulating portion 15B can ensure necessary supporting strength, and thus it becomes possible to expand selection of the materials which form the conductive 15A and the insulating portion 15B and increase both the conductivity and the supporting strength.

Figure 3:
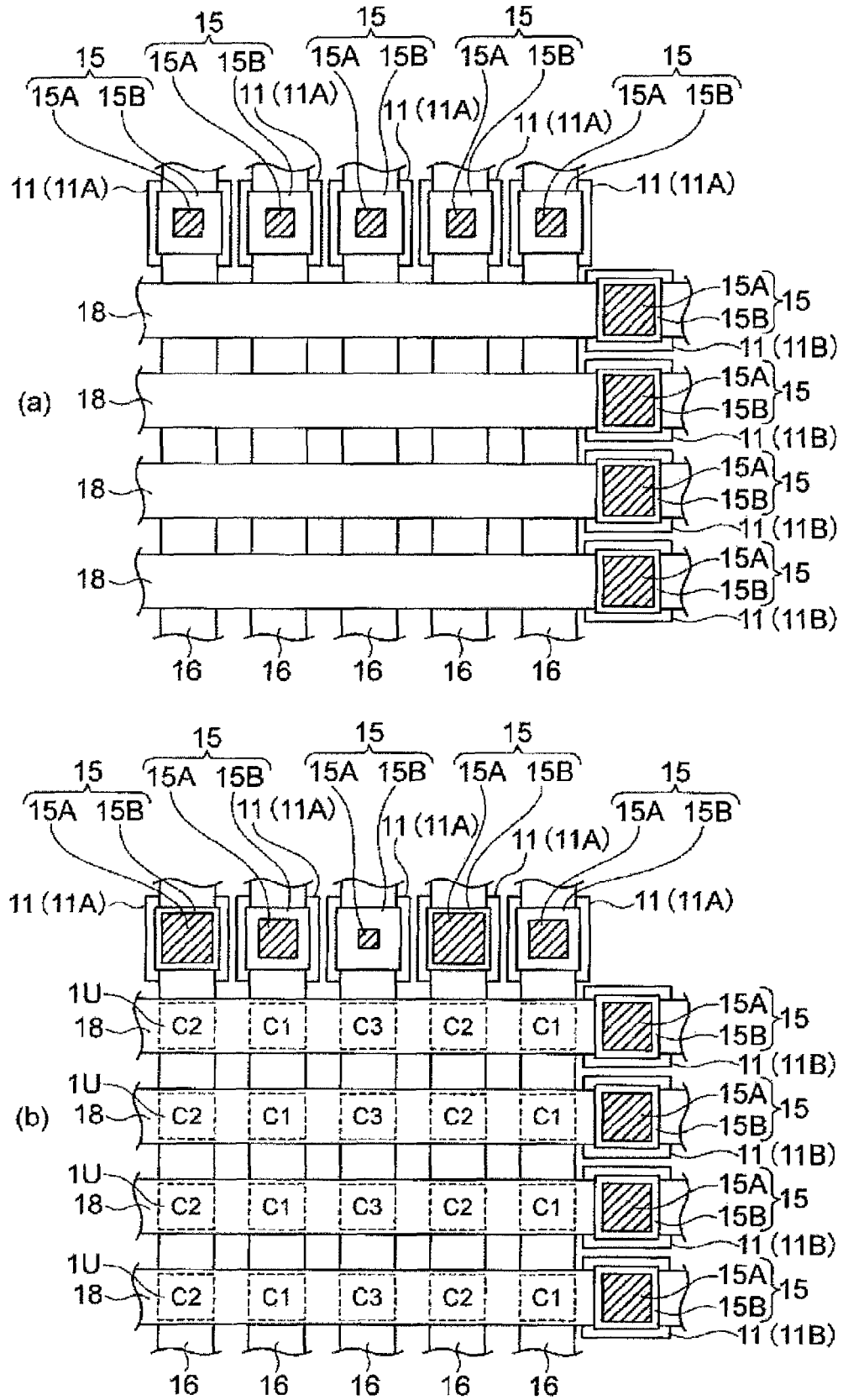
FIG. 3 is a view illustrating a specific structural example of a pole in the organic EL module according to one or more embodiments of the present invention.

FIG. 3 is a view illustrating a more specific example of the structure of the pole. In examples shown in FIGS. 3(a) and 3(b), the poles 15 include the conductive s (conduction path) 15A and at least two of the conductive s 15A have mutually different size cross-section areas. In an example shown in FIG. 3(a), the cross-section area of the conductive 15A in the pole 15 on the first terminal 11 (11B) which is connected to the upper electrode 18 is formed to be larger than the cross-section area of the conductive 15A in the pole 15 on the first terminal 11 (11A) which is connected to the lower electrode 16. According to this example, it becomes possible to decrease the resistance value of the conductive 15A which is connected to the upper electrode having a large amount of current to flow.

Further, in an example shown in FIG. 3(b), the conductive s 15A in the poles 15 on first electrodes 11 are formed so as to have different cross-section areas corresponding to each color (C1, C2, C3) of the organic EL element 1U. According to this example, by setting the cross-section area of the conductive 15A, the cross-section area of the conductive 15A can be increased such that a large amount of current flows in the organic EL element 1U which has a color (C1) susceptible to brightness degradation, whereby it becomes possible to minimize the difference in degradation rate among each color and prevent color drift due to the degradation.

At this point, even when the conductive s 15A are formed to have different cross-section areas, the cross-section areas of the insulating portions 15B are adjusted such that the whole cross-section areas of the poles 15 are uniformed as shown in FIGS. 3(a) and 3(b). Hereby, it is possible to minimize the variability in the supporting strength of each pole 15. Even when the organic EL module 1 is configured with the poles 15 having separate conduction paths as shown in FIG. 2(a), it is possible to configure the organic EL module 1 so as to have at least two mutually different cross-section areas as is the case in the configuration shown in FIG. 3. Further, the poles 15 which are shown in FIGS. 3(a) and 3(b) may be integrally configured as shown in FIG. 2(c).

Figure 4:
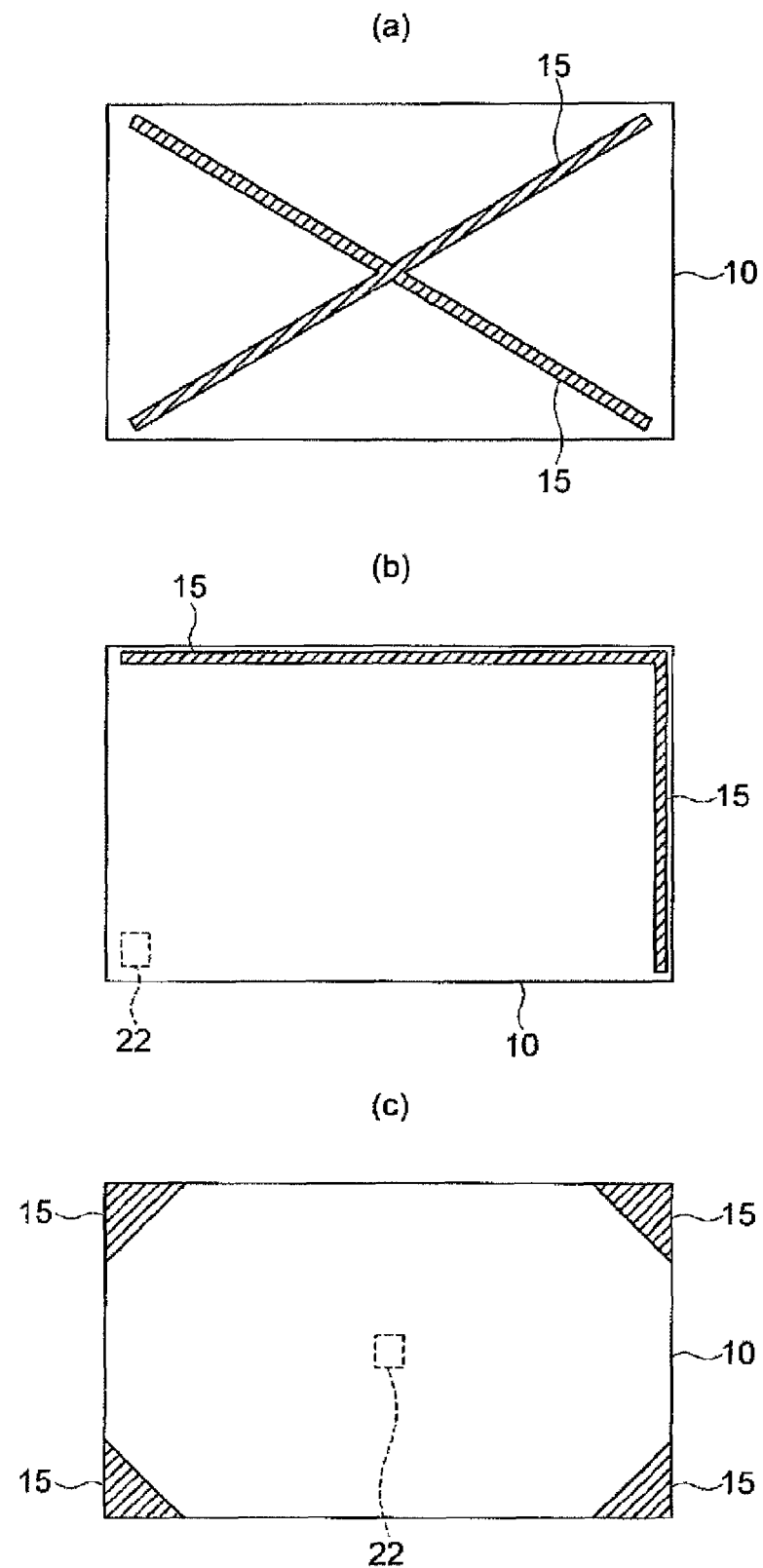
FIG. 4 is a view illustrating an example of the arrangement of a pole on an element substrate in an organic EL module according to one or more embodiments of the present invention.

FIG. 4 is a view illustrating an example of the arrangement configuration of a pole on an element substrate. In an example shown in FIG. 4(a), the pole 15 is arranged inside the element substrate 10 and the pole 15 is diagonally arranged with respect to the rectangular element substrate 10. By arranging the pole 15 in this manner, the rectangular circuit substrate 13 can be stably supported. In an example shown in FIG. 4(b), the pole 15 is arranged in the periphery of the element substrate 10. By arranging the pole 15 in this manner, the end s of the lower electrode 16 and the upper electrode 18 which are provided with a passive-matrix drive as shown in FIG. 2(a) can be connected to the pole 15. In an example shown in FIG. 4(c), the pole 15 is arranged at four corners of the element substrate 10. By arranging the pole 15 in this manner, the upper electrode and the lower electrode of two segment elements, for example, as dividing the surface of the element substrate 10 into two sections, can be connected to the respective poles 15. In an example shown in FIG. 4(b), the circuit substrate 13 can be stably supported by providing the supporting pole 22 in the periphery portion of the element substrate 10 where the pole 15 is not arranged, while in an example shown in FIG. 4(c), the circuit substrate 13 can be stably supported by providing the supporting pole 22 in the central portion of the element substrate 10 where the pole 15 is not arranged.

Figure 5:
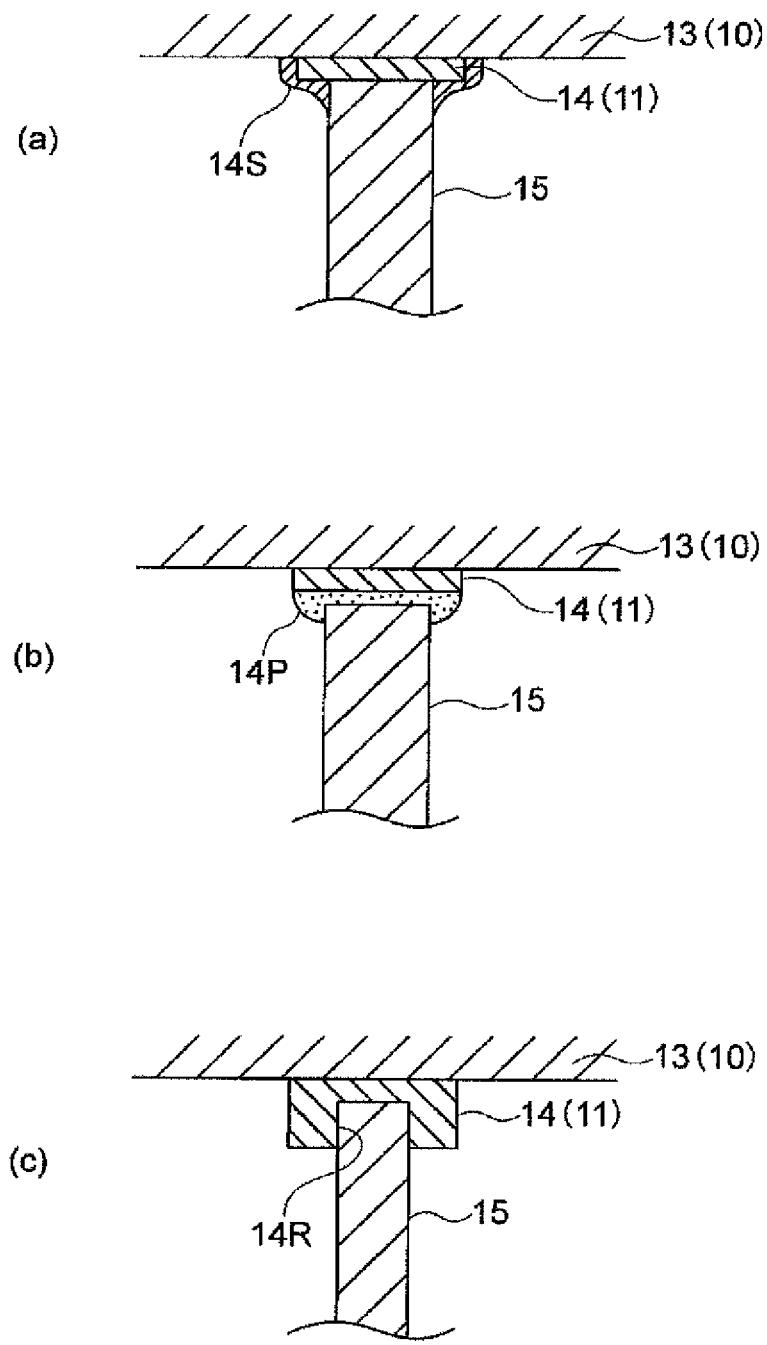
FIG. 5 is a view illustrating an example of the connection structure between a pole and a terminal in the organic EL module according to one or more embodiments of the present invention.
Figure 6:
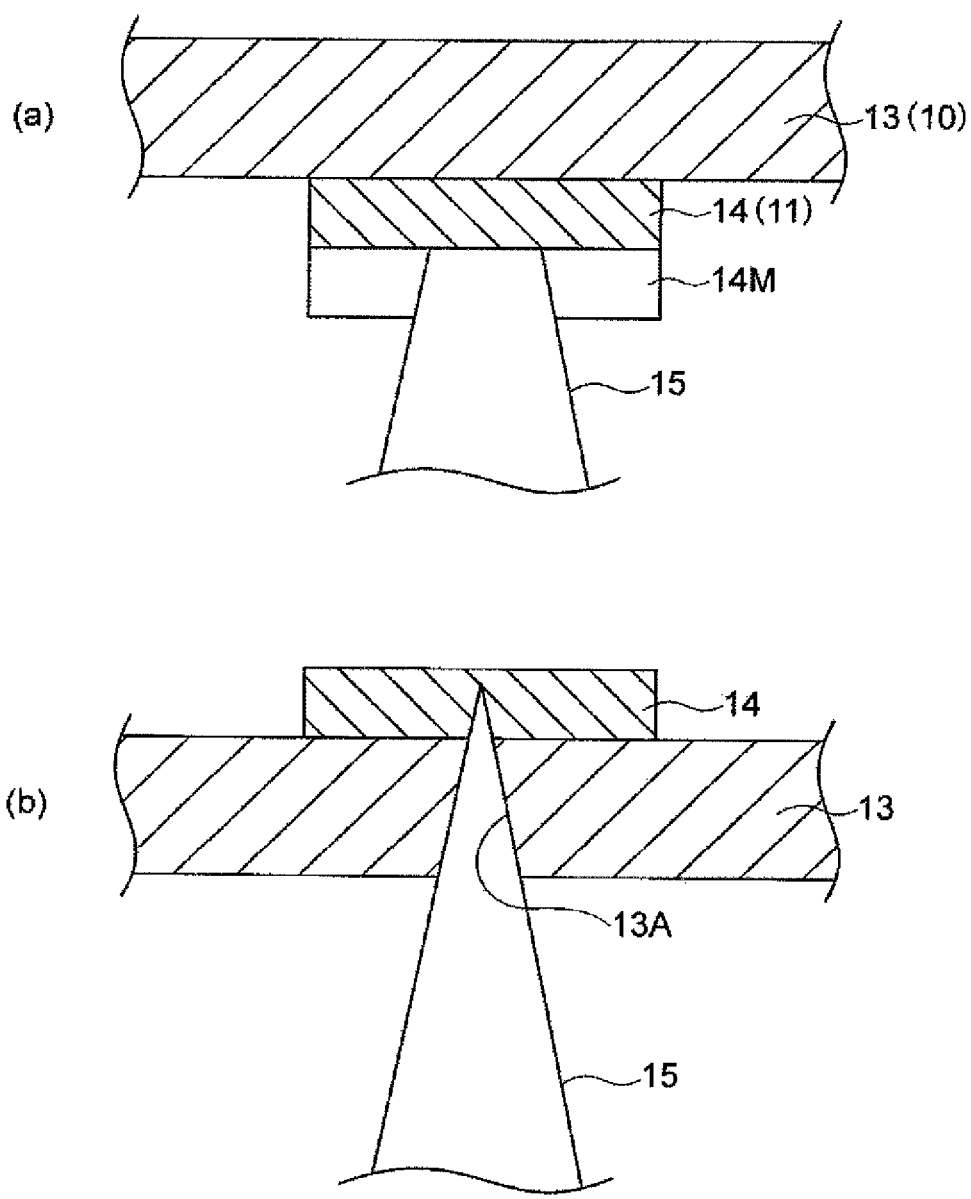
FIG. 6 is a view illustrating an example of the connection structure between a pole and a terminal in the organic EL module according to one or more embodiments of the present invention.

FIGS. 5 and 6 are views illustrating examples of connecting structures between the pole and the terminal FIG. 5(a) shows an example where the second terminal 14 beneath the circuit substrate 13 (or the first terminal 11 on the element substrate 10) and the pole 15 are connected by welding. In this example, a plating (solder plating) 14S is applied to the surface of the second terminal 14 (or the first terminal 11), and by heat pressing the second terminal 14 to which the plating 14S was applied and the end of the pole 15, the plating 14S is melted so that the second terminal 14 and the end of the pole 15 are joined.

An example shown in FIG. 5(b) illustrates that the second terminal 14 beneath the circuit substrate 13 (or the first terminal 11 on the element substrate 10) and the pole 15 are connected via conductive adhesive agent. In this example, conductive adhesive agent 14P is applied to the surface of the second terminal 14 (or the first terminal 11), and by hardening the conductive adhesive agent 14P after the second terminal 14 to which the conductive adhesive agent 14P is applied and the end of the pole 15 are pressed, the second terminal 14 and the end of the pole 15 are joined.

An example shown in FIG. 5(c) illustrates that the second terminal 14 beneath the circuit substrate 13 (or the first terminal 11 on the element substrate 10) and the pole 15 are connected via a concavo-convex fitting. In this example, a concave (or hole) 14R is formed in the second terminal 14 (or the first terminal 11), and by fitting the tip of the pole 15 into the concave 14R, the second terminal 14 and the end of the pole 15 are joined. In this example, it is possible to adopt a pin-like pole 15, which is inserted into the concave 14R thereby connecting both s. Further, this connection structure can be also adopted to provisionally connect both s when connecting them by solder welding as shown in FIG. 5(a).

In an example shown in FIG. 6, the connecting end of the pole has a circular cone side surface (or pyramid side surface). In an example shown in FIG. 6(a), by sticking the tip of a circular cone shaped pole 15 into the second terminal 14 beneath the circuit substrate 13 (or the first terminal 11 on the element substrate 10) which is covered with a protection film 14M, the pole 15 and the second terminal 14 are joined. At this time, in the example shown in the drawings, the tip of the pole 15 breaks through the protection film 14M and gets smashed when hitting the second terminal 14. As such, the smashed tip of the pole 15, which comes into close contact with the second terminal 14, can ensure a broad joining area.

In an example shown in FIG. 6(b), by inserting the tip of the circular cone shaped pole 15 into a through-hole 13A of the circuit substrate 13 and sticking the tip into the second terminal 14 which is arranged beyond the circuit substrate 13, the pole 15 and the second terminal 14 are connected. As such, the circular cone side surface comes into contact with the inner surface of the through-hole 13A, thereby mechanical joining strength can be increased, and further the circular cone side surface, by hitting the inner surface of the through-hole 13A, serves to regulate the piercing amount of the tip of the pole 15, and thus a proper connecting condition between the second terminal 14 and the pole 15 can be obtained.

Hereinafter, a specific configuration example of the above described organic EL element 1U is described.

The element substrate 10 has a light transmissive property and is formed by a base material such as glass and plastic, which can support the organic EL element 1U. As a transparent electrically conductive layer that forms the lower electrode 16, transparent metal oxide can be used, which includes ITO (Indium Tin Oxide), IZO (Indium Zinc Oxide), zinc oxide series transparent electrically-conductive film, $SnO_2$ series transparent electrically-conductive film, titanium dioxide series transparent electrically-conductive film, and so forth.

If the lower electrode 16 is pattern formed into a plurality of electrodes, an insulating layer is provided in order to ensure the electrical insulation between respective electrodes. As the insulating layer, materials such as polyimide resin, acrylic resin, silicon oxide, silicon nitride, and so forth can be used. In order to form the insulating layer, the material of the insulating layer is film-formed on the element substrate 10 on which the lower electrode 16 is pattern formed, and thereafter a patterning is performed on the lower electrode 16 to form the opening for the organic EL element 1U. Specifically, a film is formed by the spin coating method so as to have a given coating thickness on the element substrate 10 on which the lower electrode 16 is formed and then exposure and development processes are performed using an exposure mask, whereby an insulating layer which has an opening pattern for the organic EL element 1U is formed. The insulating layer is formed so as to fill a region between the patterns of the lower electrode 16 while covering a of the lateral end of the patterns, and when the organic EL element 1U is arranged in the form of dot matrix, the insulating layer is formed in a reticular pattern.

Further, in an example of passive matrix drive, a partition wall which is not shown in the drawings forms a pattern of the upper electrode 18 without using a mask and so forth or completely electrically insulates the adjoining upper electrodes 18, whereby the insulating layer is formed in a stripe shape in a direction crossing the lower electrode 16. Specifically, an insulating material such as a light-sensitive resin is applied on the above-mentioned insulating layer by the spin coating method or the like such that the thickness of the insulating material is greater than the total thickness of the organic EL layer 17 which forms the organic EL element 1U and the upper electrode 18, thereafter ultraviolet light or the like is radiated onto the light sensitive resin film via a photomask which has a stripe shaped pattern crossing the lower electrode 16, and then a partition wall having a downwardly directed tapered surface is formed by making use of the difference of development rate which is caused by the difference in the amount of exposure in a thickness direction of a layer.

The organic EL layer 17 has a lamination structure of light-emitting function layers comprising a light-emitting layer, and if either one of the lower electrode 16 and the upper electrode 18 is defined as an anode and the other of them is defined as a cathode, then a hole injecting layer, a hole transport layer, a light-emitting layer, an electron transport layer, electron injecting layer and so forth are selectively formed sequentially from the anode side. The vacuum deposition method and so forth are used as dry deposition for the film-forming of the organic EL layer 17, and coating and various types of printing methods are used as wet deposition.

Hereinafter, a forming example of the organic EL layer 17 is described. For example, first, NPE (N,N-di(naphtalence)-N,N-dipheneyl-benzidene) is film-formed as the hole transport layer. The hole transport layer has a function of transporting a positive hole which is injected from an anode to a light-emitting layer. The hole transport layer may be formed as either a single layer lamination or multiple layer lamination. Further, the hole transport layer may have a single layer formed by a plurality of materials instead of a single material, and a host material which has a high charge transfer capacity may be doped with a guest material which has a high electron donating (accepting) capacity.

Next, a light-emitting layer is film-formed on the hole transport layer. As an example, a red (R), a green (G), and a blue (B) light-emitting layers are film-formed on respective film-forming regions by means of a color painting mask. As a red (R) color, an organic material which emits a red color of styryl dye and so forth such as DCM1 (4-dicyanomethylene-2-methyl-6-(4'-dimethylaminostyryl)-4H-pyran) is used. As a green (G) color, an organic material which emits a green color of aluminato-tris-8-hydroxyquinolate (Alq3) and so forth is used. As a blue (B) color, an organic material which emits a blue color of distyryl derivative, triazole derivative and so forth is used. Of course, other materials may be used or host-guest system layers may be configured. Further, the light-emitting may be performed by using a fluorescent light emitting material or a phosphorescent light emitting material.

The electron transport layer film-formed on the light-emitting layer is film-formed by various types of film-forming methods including a resistance heating deposition method, by using various types of materials, for example, such as aluminato-tris-8-hydroxyquinolate (Alq3). The electron transport layer has a function of transporting an electron injected from the cathode to the light-emitting layer. The electron transport layer may be formed as a single layer lamination or have a multilayer structure formed as a multiple layer lamination. Further, the electron transport layer may have a single layer formed by a plurality of materials instead of a single material, and a host material which has a high charge transfer capacity may be doped with a guest material which has a high electron donating (accepting) capacity.

If the upper electrode 18 formed on the organic EL layer 17 is defined as a cathode, it can be made of materials (metal, metal oxide, metallic fluoride, alloy and so forth) which have smaller work function than an anode (for example, 4 eV or less), and specifically, an metallic film such as aluminum (Al), indium (In), and magnesium (Mg), a non-crystalline semiconductor such as doped polyaniline and doped polyphenylene vinylene, and oxidized materials such as $Cr_2O_3$, NiO, $Mn_2O_3$ may be used. A single layer structure using a metal material, a laminated layer structure using $LiO_2$, and so forth can be adopted as a structure.

As an example, the sealing layer 12 can be made of a single layer or multiple layers of an oxidized material, nitride, and oxynitride of metal and silicon, which are film-formed by means of the atomic layer deposition. For example, an oxide of aluminum film (for example, $Al_2O_2$ film) obtained in the reaction between alkyl metal such as TMA (Trimethylaluminium), TEA (Triethylaluminium) and DMAH (dimethylaluminum), and water, oxygen, alcohol or the like; Si oxide film (for example, $SiO_2$ film) obtained in the reaction between the vapor of silicon material and the vapor of water and so forth can be used.

Although the embodiments of the present invention have been described in detail with reference to the drawings, the specific configurations are not limited to these embodiments, and any design alterations which are made without deing from the scope of the invention, can be included in the present invention. Further, the content of each drawing can be a separately independent embodiment, and thus the embodiment of the present invention should not be limited to one embodiment constituted by combining each drawing.

1: organic EL module,
1U: organic EL element,
10: element substrate,
11: first terminal,
12: sealing layer,
13: circuit substrate,
14: second terminal,
15: pole,
16: lower electrode,
17: organic EL layer,
18: upper electrode,
20: drive element,
21: wiring pattern

The invention claimed is:

1. An organic EL module comprising:
an element substrate on which at least one organic EL element is formed;
a first terminal provided on the element substrate and is drawn out from the electrode of the at least one organic EL element;
a second terminal provided on a circuit substrate, wherein the second terminal is located on an opposite side of the circuit substrate than the first terminal; and
a pole that electrically connects the first terminal with the second terminal through a through-hole of the circuit substrate.

2. The organic EL module according to claim 1, wherein the pole is arranged at a periphery portion or a corner portion of the element substrate.

3. The organic EL module according to claim 2, further comprising a plurality of poles arranged at one or more periphery portions or corner portions of the element substrate.

4. The organic EL module according to claim 3, wherein each of the poles has a plurality of conduction paths that are mutually insulated and connect the first terminal with the second terminal.

5. The organic EL module according to claim 3, wherein at least two of the conductive paths have mutually different size cross-section areas.

6. The organic EL module according to claim 3, wherein cross-section areas of the poles are uniform.

7. The organic EL module according to claim 2, wherein the pole is configured with a conductive member.

8. The organic EL module according to claim 2, wherein the pole is configured with a conductive adhesive agent.

9. The organic EL module according to claim 2, wherein the pole is configured with a conductive film.

10. The organic EL module according to claim 2, wherein the pole is formed integrally with the circuit substrate.

11. The organic EL module according to claim 2, wherein the connecting end of the pole has a circular cone side surface or pyramid side surface.

12. The organic EL module according to claim 2, wherein a reinforcing supporting pole is provided between the element substrate and the circuit substrate.

13. The organic EL module according to claim 2, wherein one or both of the first terminal and the second terminal and the pole are welded.

14. The organic EL module according to claim 2, wherein one or both of the first terminal and the second terminal and the pole are connected via conductive adhesive agent.

15. The organic EL module according to claim 2, wherein one or both of the first terminal and the second terminal and the pole are connected via a concavo-convex fitting.

16. The organic EL module according to claim 2, wherein plating is applied to one or both of the first terminal and the second terminal.

17. The organic EL module according to claim 2, wherein the sealing layer is pattern formed so as to exclude the overhead portion of the first terminal.

18. The organic EL module according to claim 2, wherein the circuit substrate is arranged so as to cover the sealing layer.

19. The organic EL module according to claim 2, wherein a filler member is filled between the element substrate and the circuit substrate.

20. The organic EL module according to claim 19, wherein the end faces of the element substrate, the circuit substrate and the filler member are flush with each other.

* * * * *